(12) United States Patent
Gupta et al.

(10) Patent No.: US 8,130,567 B2
(45) Date of Patent: Mar. 6, 2012

(54) WRITE CIRCUITRY FOR HIERARCHICAL MEMORY ARCHITECTURE

(75) Inventors: Siddharth Gupta, Greater Noida (IN); Nitin Jain, Greater Noida (IN); Anand Mishra, Greater Noida (IN)

(73) Assignee: STMicroelectronics Pvt. Ltd., Greater Nodia (UP) (IN)

( * ) Notice: Subject to any disclaimer, the term of this patent is extended or adjusted under 35 U.S.C. 154(b) by 127 days.

(21) Appl. No.: 12/641,102

(22) Filed: Dec. 17, 2009

(65) Prior Publication Data

US 2010/0157699 A1    Jun. 24, 2010

(30) Foreign Application Priority Data

Dec. 24, 2008    (IN) ............................ 2936/DEL/2008

(51) Int. Cl.
*G11C 7/00*    (2006.01)

(52) U.S. Cl. ................................................. 365/189.16
(58) Field of Classification Search ............. 365/189.19
See application file for complete search history.

(56) References Cited

U.S. PATENT DOCUMENTS

| 6,172,918 B1 * | 1/2001 | Hidaka | 365/189.11 |
| 6,717,443 B2 * | 4/2004 | Barnes | 327/51 |
| 7,359,256 B2 * | 4/2008 | Ha et al. | 365/191 |

* cited by examiner

*Primary Examiner* — Hoai V Ho
*Assistant Examiner* — Anthan Tran
(74) *Attorney, Agent, or Firm* — Hogan Lovells US LLP (57) ABSTRACT

A memory architecture includes a plurality of local input and output circuitries, with each local input and output circuitry associated with at least one memory bank. The memory architecture also includes a global input and output circuitry, which includes a plurality of global sub-write circuitries, is coupled to the plurality of local input and output circuitries One global sub-write circuitry is enabled and provides a write-data to a selected local input and output circuitry.

15 Claims, 8 Drawing Sheets

WRITE CIRCUITRY FOR HIERARCHICAL MEMORY ARCHITECTURE

RELATED APPLICATION

The present application claims priority of Indian Patent Application No. 2936/DEL/2008 filed Dec. 24, 2008, which is incorporated herein in its entirety by this reference.

FIELD OF THE INVENTION

The present invention relates to write circuitry for hierarchical memory architectures and more particularly, to multi-banked memory architectures.

RELEVANT BACKGROUND

Generally, as the size of memory increases, the number of cells in the memory also increases and parameters, such as time delays, parasitic capacitances, etc., become significant. These parameters, in turn, affect the overall performance of the memory. In order to improve the memory performance, it is a common practice to segment the memory. For example, in the hierarchical memory architecture, such as a multi-banked memory architecture, a single block of memory is virtually divided into multiple memory banks or sub-arrays. Each memory bank includes a number of memory cells arranged in rows and columns called word lines and bit lines, respectively. In addition, each memory bank is associated with a local clock generation circuitry and a local write circuitry, collectively referred to as local input and output circuitry (LIOC). The LIOC includes a system of write data buses. LIOCs of different memory banks interact with a global input and output circuitry (GIOC) for a bi-directional transfer of data between the LIOCs and the GIOC. The GIOC includes a global write circuitry and a global clock generation circuitry. Similar to the LIOCs, the GIOC also includes global data buses.

Typically, before performing a write operation, the global write circuitry of the GIOC is pre-charged to a level of supply voltage through a number of pull-up pre-charge devices. The pre-charge devices are associated with a number of global sub-write circuitries within the global write circuitry. The pull-up pre-charge devices of all the global sub-write circuitries are triggered even if only one global sub-write circuit is selected for the write operation. Furthermore, even though the data to be written (write-data) is to be transferred to only the LIOC of a selected memory bank, the LIOCs of several unselected memory banks also get un-necessarily triggered. This leads to high dynamic power consumption as the write-data is propagated from the GIOC to the LIOCs of several unselected memory banks as well.

Further, the write operation in the LIOC of a memory bank is inherently slow due to the large size of components, for example, logic gates of the GIOC. Therefore, to increase the speed of the write operation in an LIOC, the size of the pull-up pre-charge devices is considerably increased, thereby increasing peak current and dynamic power dissipation.

During the GIOC-LIOC communication, resetting of the GIOC is not initiated until the write operation is completed in the LIOC. In addition, the GIOC requires tuning of the pulse width of a global write clock signal in order to reset the write circuitry of the GIOC for different compiler ranges i.e., variable number of memory banks. Such tuning of the global write clock signal for a memory bank having large compiler range results in an extended clock cycle time of the global write clock signal even for a memory bank having a smaller compiler range. Due to this extended clock cycle time, the performance of the memory bank having smaller compiler range gets adversely affected.

SUMMARY

This summary is provided to introduce concepts related to a write circuitry for a memory having a hierarchical memory architecture, which is further described below in the detailed description. This summary is not intended to identify essential features of the claimed subject matter nor is it intended for use in determining the scope of the claimed subject matter.

In one embodiment, the memory architecture comprises a plurality of local input and output circuitries. Each LIOC is associated with at least one memory bank. The memory architecture further comprises a global input and output circuitry coupled to the plurality of local input and output circuitries. In addition, the global input and output circuitry comprises a plurality of global sub-write circuitries. For a write operation, one global sub-write circuitry out of the plurality of global sub-write circuitries is enabled. Further, the enabled global sub-write circuitry provides a write-data to a selected LIOC.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION OF PREFERRED EMBODIMENTS

The disclosed subject matter relates to a write circuitry for a memory having hierarchical memory architecture and, in particular, relates to the local and global write circuitries for a memory in a hierarchical memory architecture.

Generally, write-data is stored in electronic form within a scheme of integrated circuits known as memory. Memory, such as static random access memory (SRAM), holds write-data in the form of bits represented by an underlying level of voltage. For example, the write-data is represented either as high voltage when writing a logic level "1", or as low voltage when writing a logic level "0". Further, the memory may be designed using a diversity of architectures such as a multi bank or hierarchical memory architecture, a single-channel memory architecture, a dual-channel memory architecture, etc.

In the hierarchical memory architecture, the memory is segmented into multiple memory banks. The hierarchical memory architecture includes a global input and output circuitry (GIOC) having a global write circuitry. The hierarchical memory architecture further includes one or more local input and output circuitries (LIOC), each associated with one memory bank and each having a local write circuitry. In a typical hierarchical memory architecture, the write-data is communicated from the GIOC to all the LIOCs in response to a write-operation. Such a hierarchical memory architecture suffers from high peak current and unwanted dynamic power consumption. In addition, the dynamic power consumption increases as the number of memory banks in the memory increases.

An exemplary write memory architecture for hierarchical memories that has significantly lower peak current and dynamic power consumption is described herein. In one implementation, the GIOC facilitates propagation of the write-data into a selected memory bank through an LIOC associated with the selected memory bank. The GIOC includes a global write circuitry, which further includes two data buses namely global write true (GWRT) data bus and global write false (GWRF) data bus. The two data buses correspond to two global sub-write circuitries of the global write circuitry namely GWRT circuitry and GWRF circuitry. Each global sub-write circuitry has a storage element, an odd-delay circuit, and a pull-up pre-charge circuit. Based on the availability of write-data, either the GWRT or the GWRF circuitry is enabled by a global write clock signal (GIOC-WRCLK) provided through a full transmission gate. For example, for writing a "one", the GWRT circuitry is used, while for writing a "zero", the GWRF circuitry comes into operation.

In said implementation, as and when the storage element is set and write-data is obtained on the respective global data bus, the GIOC-WRCLK can be decoupled from the GWRT/GWRF circuitry by using a decoupling circuit. Further, though the global data bus is coupled to all the LIOCs, only one associated LIOC, i.e., the LIOC associated with the selected memory bank receives the write-data. Such an LIOC is selected based on a local write clock signal.

As the write-data is transferred from the GIOC to the associated LIOC, a voltage level of a signal on the global data bus is tracked by a level sensitive triggering circuit. When the write-data latches onto the LIOC associated with the selected memory bank, the voltage level of the GWRT signal begins to change. Upon sensing a change in the voltage level, the level sensitive triggering circuit facilitates resetting of the storage element in the GIOC. Depending on the load with respect to different compiler ranges on the global write circuitry, the rising or the falling edge of the signal on the global data bus varies. During this, it is ensured that the write-data gets latched onto the LIOC before the GIOC is reset.

The present subject matter provides self-adjustable precharging of the GIOC and facilitates replication of the write-data from the GIOC to the LIOC associated with a selected memory bank. The local and global write circuitry, as disclosed herein, substantially reduces peak current and dynamic power dissipation. In addition, the faster write-data propagation to memory banks is achieved. The present subject matter also offers reduced design tuning effort over a variable compiler range.

The write circuitry can be implemented in any memory, such as a static random access memory (SRAM), a multi-port SRAM, and a dynamic random access memory (DRAM), having a hierarchical memory architecture, for example, a multi-banked memory architecture. Devices that can implement the disclosed write circuitry in the memory include, but are not limited to, set-top boxes, computing devices, televisions, mobile phones, laptops, personal digital assistants (PDAs), and so on. These devices can be employed in a variety of applications such as data gathering and/or processing, streaming, conferencing, surveillance, etc.

While aspects of described systems and methods for the input and output circuitries for a memory can be implemented in any number of different computing systems, environments, and/or configurations, the embodiments are described in the context of the following exemplary system architecture(s). Additionally, the word "connected" is used throughout for clarity of the description and can include either a direct connection or an indirect connection. The descriptions and details of well-known components are omitted for simplicity of the description. Although the devices are explained herein as certain N-channel and P-channel devices, it can be appreciated that complementary devices are also possible in accordance with the present subject matter. Accordingly, the logic level of control signals can either be active low or active high. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

Figure 1A:
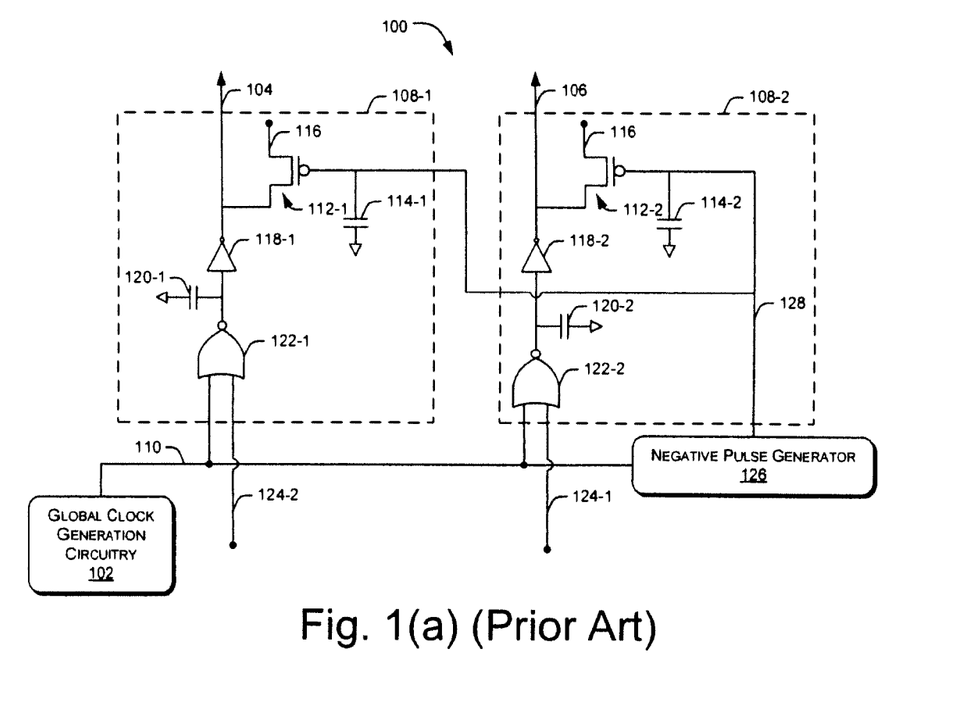
FIG. 1(a) illustrates a typical global input and output circuitry (GIOC) for a memory.

FIG. 1(a) illustrates a typical global input and output circuitry (GIOC) 100 in a hierarchical memory architecture. The GIOC 100 includes a global write circuitry, at least one global data bus, and a global clock generation circuitry 102. The global data bus has a global write true data bus 104, hereinafter referred to as GWRT 104, to carry a write-data such as logic level "one" and a global write false data bus 106, hereinafter referred to as GWRF 106, to carry a write-data such as logic level "zero". The global write circuitry is typically divided into a GWRT circuitry 108-1 and a GWRF circuitry 108-2, which provide the write-data to the GWRT 104 and the GWRF 106, respectively.

The GWRT circuitry 108-1 and the GWRF circuitry 108-2 are activated by a global write clock signal 110, hereinafter referred to as GIOC-WRCLK 110, generated by the global clock generation circuitry 102. Both the GWRT circuitry 108-1 and the GWRF circuitry 108-2 are electrical networks of pull-up pre-charge devices, driver capacitors, logic gates, etc. The pull-up pre-charge devices are connected to the GWRT 104 and the GWRF 106. The pull-up pre-charge devices, are realized using capacitors and p-channel MOSFETS, hereinafter referred to as pMOSs. For example, the GWRT 104 can be connected to the drain of a pMOS 112-1 and the GWRF 106 can be connected to the drain of a pMOS 112-2. The gates of the pMOSs 112-1 and 112-2 can be connected to capacitors $C_{PPT}$ 114-1 and $C_{PPF}$ 114-2 respectively, while the sources of the pMOSs 112-1 and 112-2 are fed with a supply voltage $V_{DD}$ 116. Further, the GWRT 104 can be connected to an inverter 118-1, a driver capacitor 120-1, and a NOR gate 122-1, while the GWRF 106 can be connected to an inverter 118-2, a driver capacitor 120-2, and a NOR gate 122-2.

On activation of the GIOC 100 by the GIOC-WRCLK 110 for a write operation, the global data bus facilitates the propagation of the write-data from the global write circuitry to a selected memory bank (in which the write-data needs to be written) through a local input and output circuitry (LIOC) associated with the memory bank. However, the write-data also propagates within LIOCs of un-selected memory banks.

In operation, the NOR gate 122-1 and the NOR gate 122-2 are fed with the GIOC-WRCLK 110. The GIOC-WRCLK 110 is an active low signal. The GIOC-WRCLK 110 is applied as a first input to the NOR gate 122-1 and the NOR gate 122-2 at a falling edge of the GIOC-WRCLK 110. Subsequently, the write-data, such as DATA 124-1, is applied as a second input to the NOR gate 122-2. The NOR gate 122-1 is provided with another write-data, such as DATAB 124-2, as a second input. The DATAB 124-2 has a logic level complementary to that of the DATA 124-1. For example, at an instant, when the DATA 124-1 has a logic level "one", the DATAB 124-2 has a logic level "zero", and vice versa. In general, at the falling edge of the GIOC-WRCLK 110, the write-data obtained on GWRT 104 and on GWRF 106, is propagated within all the LIOCs (not shown in FIG. 1) coupled to the GIOC 100.

Further, at a rising edge of the GIOC-WRCLK 110, the GIOC-WRCLK 110 is fed to a negative pulse generator 126 to generate a negative pulse signal 128. The negative pulse signal 128 having a logic level "zero" is applied to the gate of the pMOSs 112-1 and 112-2. Such an application of the negative pulse signal 128 is performed when the GIOC-WRCLK 110 is at its rising edge in order to reset the GWRT 104 and the GWRF 106 after the write operation is completed, i.e., after the write-data is stored in the selected memory bank.

Generally, when the GIOC-WRCLK 110 is provided to the NOR gate 122-1 and the NOR gate 122-2 included in the GIOC 100, both the pMOSs 112 are activated even though data is applied only at one of the data inputs 124. As a result, there occurs an unwanted power consumption due to triggering of an unused pMOS, say pMOS 112-2 and an un-necessary charging/discharging of associated capacitor, say $C_{PPT}$ 112-2. Additionally, the GWRT 104 and the GWRF 106 are highly capacitive in nature due to the high load offered by the rows or word lines in the memory banks, large devices in the GIOC 100 such as the NOR gates 122-1 and 122-2 and the negative pulse generator 126, onto the GIOC-WRCLK 110. Therefore, propagation of the write-data to the LIOC of the selected memory bank through the GWRT 104 or the GWRF 106 is inherently slow. In addition, since the GWRT 104 and the GWRF 106 are driving huge capacitive loads, the GWRT 104 and the GWRF 106 are to be rapidly pre-charged within a pre-determined cycle time of the negative pulse signal 128. For this, the size of the pull-up pre-charge devices realized using the pMOSs 112-1 and 112-2 is kept large, thereby resulting in high peak current.

Further, the large pMOS devices 112-1 and 112-2 in the pull-up pre-charge devices are not scaled with the number of memory banks in the hierarchical architecture. Also, the peak current consumption associated with the charging and discharging of the GWRT 104 and the GWRF 106 remains the same and does not depend upon the status of the write-data. Thus, the peak current and the dynamic power consumed per bit can surpass the acceptable range, thereby making the memory compiler un-optimized over a certain compiler range.

Furthermore, the number of rows in a particular memory bank are fixed; however, they can vary across different memory banks. As the number of rows or the number of memory banks increases, the load on the GWRT 104 and the GWRF 106 also increases, leading to slow discharge of the GWRT 104 and the GWRF 106 and hence, relatively slower transfer of the write-data into the memory banks. For a given number of rows, or in other words, for a fixed compiler range, the time duration to reset the GWRT 104 and the GWRF 106 can be determined by the pulse width of the GIOC-WRCLK 110. However, a change in the compiler range requires an alteration in the pulse width of the GIOC-WRCLK 110 to reset the GWRT 104 and the GWRF 106 after the write operation is complete.

In order to reliably cater to memory banks having a variety of compiler ranges, the pulse width of the GIOC-WRCLK 110 is designed for the memory bank having the highest compiler range. Since resetting of the GWRT 104 and the GWRF 106 is dependent on the pulse width of the GIOC-WRCLK 110, such tuning of the pulse width can result in an overall write cycle time penalty for the memory bank having a relatively smaller compiler range. In addition, the pulse width of a reset signal (to initiate pre-charging of the GWRT 104 and GWRF 106) has to be over-designed to cater to the highest compiler range.

Figure 1B:
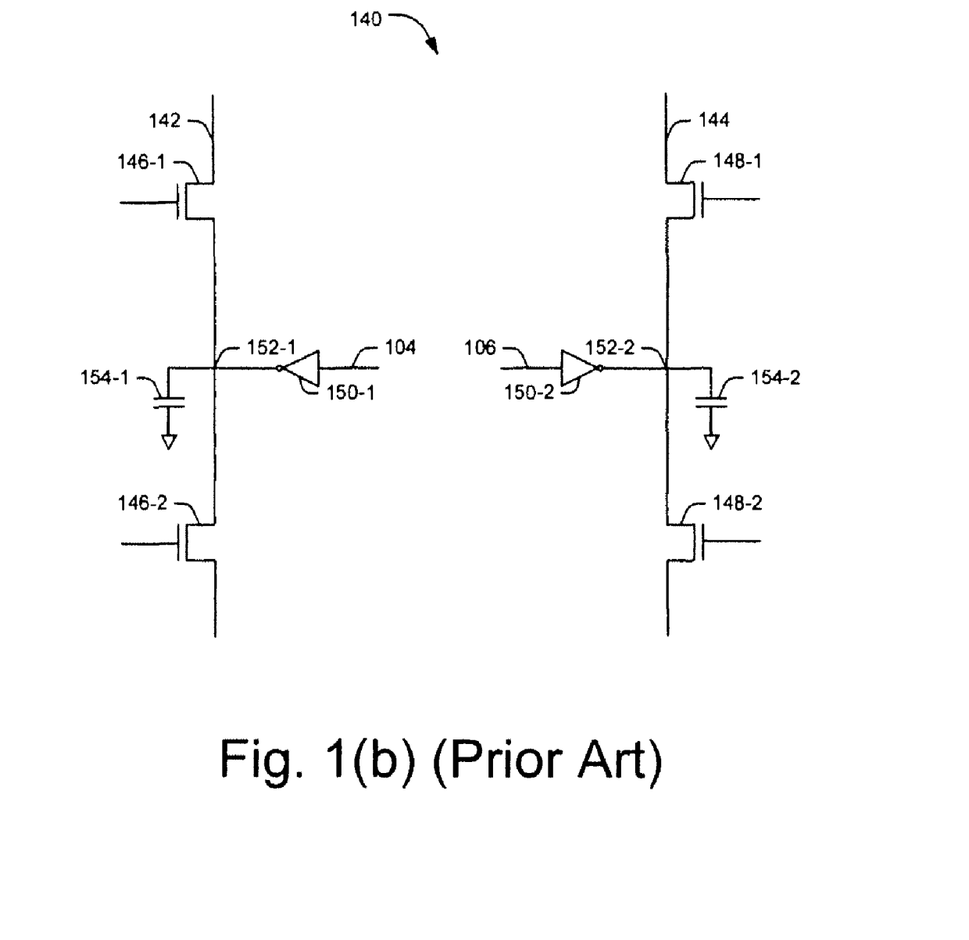
FIG. 1(b) illustrates a typical local input and output circuitry (LIOC) for a memory.

FIG. 1(b) illustrates a typical local input and output (LIOC) 140 for a memory. Typically, each LIOC such as LIOC 140 is coupled to a memory bank. An LIOC can also be shared between multiple memory banks. The explanation hereinafter has been provided with respect to one LIOC, for example, LIOC 140, coupled to a memory bank selected for a write operation; however, it can be understood that the explanation can easily be extended to other LIOCs in the memory as well.

The LIOC 140 includes a local write circuitry. The LIOC 140 also includes a local data bus or bit line having two components, namely bit line true (BLT) 142 and bit line false (BLF) 144. The BLT 142 and the BLF 144 are complementary to each other. In other words, when the BLT 142 has a logic level "one", referring to a high voltage, then the BLF 144 has a logic level "zero", referring to a low voltage. Similar to the global write circuitry, the local write circuitry is also an electrical network of transistors, capacitors, logic gates, etc.

The global data bus (as explained in FIG. 1(a)) facilitates the transfer of the write-data from the global write circuitry to a selected memory bank through the local write circuitry and bit lines electrically coupled to the memory bank. The BLT 142 is connected to two n-channel MOSFETs 146-1 and 146-2, hereinafter collectively referred to as nMOSs 146, which have their gates connected to column select lines. Similarly, the BLF 144 is connected to two nMOSs 148-1 and 148-2, hereinafter collectively referred to as nMOS 148, which also have their gates connected to the column select lines.

The nMOSs 146 and 148 may serve as bit line write-drivers to rapidly unbalance the bit lines so that a correct value is stored in a selected memory cell. The BLT 142 is connected to the GWRT 104 in the GIOC 100 through an inverter 150-1 at a write-node true (WRT) 152-1 located on the BLT 142. Similarly, the BLF 144 is connected to the GWRF 106 through an inverter 150-2 at a write-node false (WRF) 152-2 located on the BLF 144. Large parasitic capacitances $C_{WRT}$ 154-1 and $C_{WRF}$ 154-2 appear at the write nodes WRT 152-1 and WRF 152-2, respectively.

In operation, the write-data, such as the DATA 124-1, from the GIOC 100 is replicated onto all the LIOCs of the memory banks irrespective of the selection of any particular memory bank for the write-operation. In other words, any toggling of the GWRT 104 and the GWRF 106 in the GIOC 100 leads to a toggling of the WRT 152-1 and the WRF 152-2 in the LIOC 140 even though the memory banks associated with the WRT 152-1 and WRF 152-2 are unselected. Such toggling leads to an unwanted consumption of a substantial amount of dynamic power adding to the global power consumption as described in FIG. 1(a).

Exemplary Systems

Figure 2A:
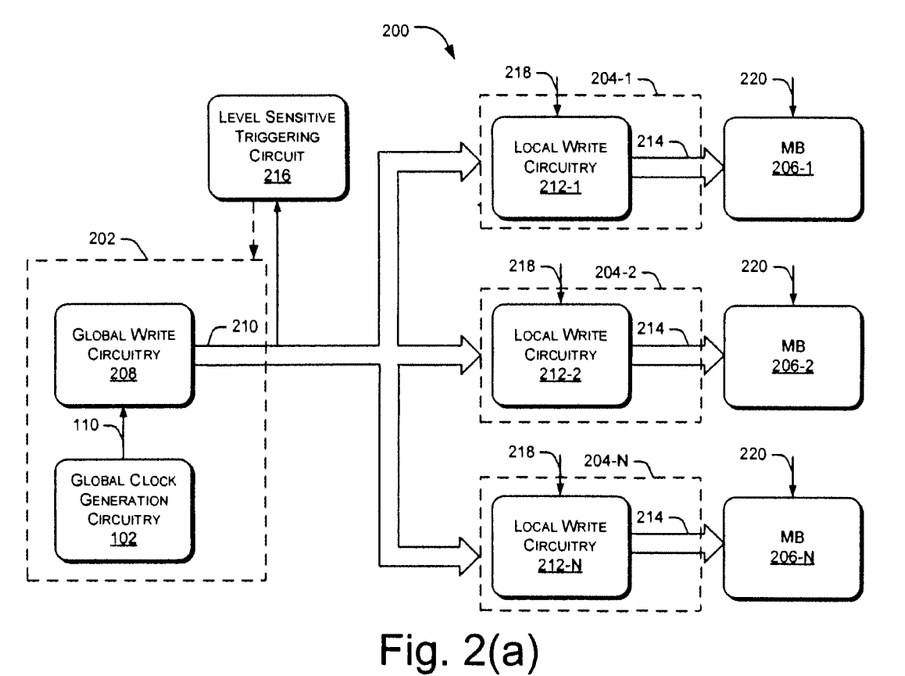
FIG. 2(a) illustrates a memory architecture having an exemplary global write circuitry and a number of exemplary local write circuitries according to one embodiment of the present subject matter.

FIG. 2 (a) illustrates an exemplary hierarchical memory architecture 200 having an exemplary global input and output circuitry (GIOC) 202 and a number of exemplary local input and output circuitries (LIOCs) 204-1, 204-2, . . . 204-N, collectively referred to as LIOCs 204. In one embodiment, the memory architecture 200 includes a memory segmented into multiple memory banks (MB) such as MB 206-1, MB 206-2, . . . MB 206-N, collectively referred to as MB 206. Further, the GIOC 202 includes an exemplary global write circuitry (GWC) 208 and at least one global data bus 210 divided into at least two data buses namely the global write true data bus (GWRT) 104 and the global write false data bus (GWRF) 106. It will be appreciated that there can be several data buses in the GIOC 202.

Further, each of the LIOCs 204 has a corresponding exemplary local write circuitry (LWC), such as LWC 212-1, LWC 212-2, . . . LWC 212-N, collectively referred to as LWC 212, and a local data bus 214. Each LIOC, namely LIOC 204-1, LIOC 204-2, . . . , LIOC 204-N, is coupled to the memory bank MB 206-1, MB 206-2, . . . MB 206-N respectively, through the local data bus 214. In another embodiment, an LIOC out of LIOCs 204, for example, LIOC 204-1, can be shared between any two memory banks, for example, MB 206-1 and MB 206-2 through a shared local data bus. The local data bus 214 includes the bit line(s) BLT 142 and BLF 144. Each LIOC is also coupled to the GIOC 202 through the global data bus 210.

Figure 2B:
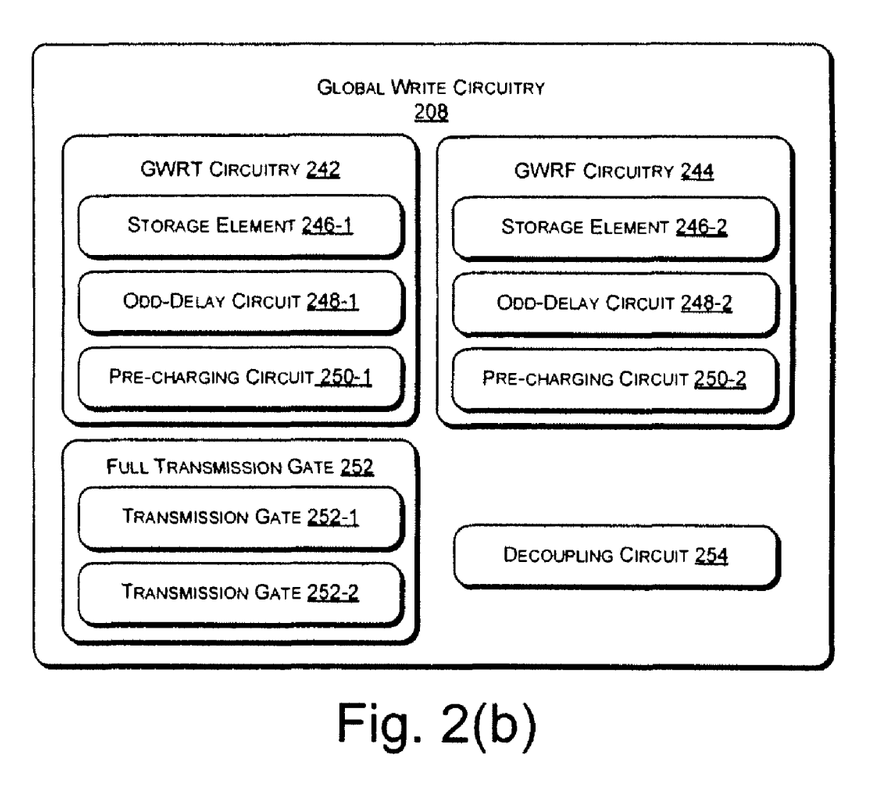
FIG. 2(b) illustrates the exemplary global write circuitry and its components according to one embodiment of the present subject matter.

Further, as will be illustrated in FIG. 2(b), the GWC 208 can be partitioned into two global sub-write circuitries, namely a GWRT circuitry and a GWRF circuitry for writing "1" and "0" respectively. The construction and the operation of each global sub-write circuitry will be discussed in detail in FIG. 3. Additionally, a level sensitive triggering circuit 216 is operatively coupled between the LIOCs 204 and the GIOC 202. The level sensitive triggering circuit 216 can be implemented using any of the mechanisms known in the art such as through a Schmitt trigger.

In one embodiment, three control signals are included in the hierarchical memory architecture 200, namely the GIOC-WRCLK 110, an exemplary local write clock signal (YCLK-WR) 218, and a memory select signal 220. The memory select signal 220 is a conventional memory select signal provided by a memory bank control circuitry (not shown in figure) to select a particular memory bank for the write operation. The YCLK-WR 218 is a multiplexed signal of a conventional write-enable signal, a conventional local clock signal (also referred to as local signal) generated by a conventional local clock generation circuitry, and a signal corresponding to the most significant bits of a row address, hereinafter referred to as row address signal. The YCLK-WR 218 is generated by a local write clock generation circuitry (not shown in the figure). Similarly, the global clock generation circuitry 102 provides the global write clock signal (GIOC-WRCLK) 110.

In one implementation, when the write-data has to be written to a memory bank, for example, the MB 206-1, the memory select signal 220 is activated for only the MB 206-1. Additionally, an active low YCLK 218 is provided to an LIOC, such as the LIOC 204-1, while an active high YCLK 218 is provided to the rest of the LIOCs in order to select only the LIOC 204-1 associated with the selected MB 206-1. Hereinafter, a selected LIOC is an LIOC associated with a memory bank selected for the write operation. Based on the availability of the write-data, the GIOC-WRCLK 110 is provided to activate either the GWRT or GWRF circuitry of the GWC 208.

In said implementation, the GIOC-WRCLK 110 facilitates the propagation of the write-data into the selected memory bank, for example, MB 206-1, through the selected LIOC, for example, LIOC 204-1. The GIOC-WRCLK 110 facilitates in storing the write-data in the GWC 208. Typically, a GIOC requires tuning of the pulse width of a global write clock signal in order to reset the write circuitry of the GIOC for different compiler ranges i.e., variable number of memory banks. However, in the said implementation, after storing the write-data, the GIOC 202 decouples the GIOC-WRCLK 110 from the GWC 208 so that the design and tuning of pulse width of GIOC WRCLK 110 is independent of the varying compiler ranges. Further, the write-data is transferred to the selected LIOC 204-1 from the GIOC 202 through the global data bus 210. Within the selected LIOC 204-1, the write-data is stored in a storage element (not shown in the figure).

Meanwhile, the level sensitive triggering circuit 216 senses the change in the level of write-data on the global data bus 210. Such a change in level is an indication of storage of write-data in the selected LIOC 204-1. When the level of the global data bus 210 changes, the GWC 208 initiates a reset signal to reset the state of GWC 208 and in turn, the state of the global data bus 210. Alternatively, the GIOC 202 delays the resetting process until the write-data is latched in the selected LIOC, i.e., the LIOC 204-1 in the present case. Once the GWC 208 is reset, the GIOC 202 or the global data bus 210 in particular, are pre-charged for a next write-operation.

In this way, self-adjustable pre-charging of the GIOC 202 is achieved and the write-data is replicated from the GIOC 202 to the local input and output LIOC 204-1 associated with the selected memory bank 206-1. The construction and operation of the GWC 208 is discussed in detail in the following paragraphs.

FIG. 2(b) illustrates the exemplary GWC 208 and its components. As described in FIG. 2(a), the GIOC 202 includes the exemplary GWC 208. The GWC 208 can be partitioned into global sub-write circuitries, namely, a GWRT circuitry 242 and a GWRF circuitry 244. The GWRT circuitry 242 and the GWRF circuitry 244 communicate with the LIOCs 204 through the data buses GWRT 104 and the GWRF 106 respectively.

In one implementation, the GWRT circuitry 242 includes a storage element 246-1, an odd-delay circuit 248-1, and a pre-charging circuit 250-1. Similarly, the GWRF circuitry 244 includes a storage element 246-2, an odd-delay circuit 248-2, and a pre-charging circuit 250-2. The storage elements 246-1 and 246-2 are collectively referred to as storage elements 246. Similarly, the odd-delay circuits 248-1 and 248-2 are collectively referred to as odd-delay circuits 248, while the pre-charging circuits 250-1 and 250-2 are collectively referred to as pre-charge circuits 250. Additionally, a full transmission gate 252 and a decoupling circuit 254 are provided in common for both the GWRT circuitry 242 and the GWRF circuitry 244.

In said implementation, the full transmission gate 252 is realized using two CMOS transmission gates 252-1 and 252-2, hereinafter referred to as transmission gates 252-1 and 252-2. Based upon the availability of the write-data, such as the DATA 124-1 and DATAB 124-2, the full transmission gate 252 allows the GIOC-WRCLK 110 to facilitate write-data propagation in either the GWRT circuitry 242 or the GWRF circuitry 244. The decoupling circuit 254 is implemented using logic gates to decouple the GIOC-WRCLK 110 from the GWC 208 once the write-data is stored in the storage element 246-1 or storage element 246-2, as the case may be. The storage element 246-1 can be a latch, flip flop, or in general, any logic circuit capable of storing one bit of write-data. In said implementation, the storage element 246-1 is a reset-set (RS) latch. The odd-delay circuit 248-1 is a circuit having an odd number of inverters. The odd-delay circuit 248-1 inverts the logic of an incoming signal after a computed delay and subsequently, resets the storage element 246-1. The delay is computed based on the time required to store the write-data in the selected LIOC 204-1. Accordingly, in one example, the time required to store the write-data may depend on the spatial location of the selected LIOC 204-1 within the memory 200. The pre-charging circuit 250-1 charges the GWRT circuitry 242 to a pre-determined voltage level after the storage element 246-1 is reset. The storage element 246-2, the odd-delay circuit 248-2, and the pre-charging circuit 250-2 of the GWRF circuitry 244 are similar in construction and operation to those included in the GWRT circuitry 242.

In operation, based on the availability of the write-data, the GIOC-WRCLK 110 facilitates propagation of the write-data into a selected global sub-write circuitry. For example, for writing a write-data such as "one", represented by DATA 124-1, the GWRT circuitry 242 is selected by the transmission gate 252-1 on application of the DATA 124-1. The DATA 124-1 is stored in the storage element 246-1 and is available on the global data bus 210, i.e., the GWRT 104. Meanwhile, the GIOC-WRCLK 110 is decoupled from the GWC 208 by the decoupling circuit 254, thus enabling design of GIOC-WRCLK 110 in such a way that it is independent of compiler ranges. Also, the DATA 124-1 is transferred from the GIOC 202 to the selected LIOC 204-1 through the global data bus 210.

Within the LIOC 204-1, the DATA 124-1 is stored in a storage element. As the DATA 124-1 is being stored in the LIOC 204-1, the level sensitive triggering circuit 216 senses the change in a voltage level of the global data bus 210 and sends a voltage feedback signal to the odd delay-circuit 248-1 to reset the storage element 246-1. Once the storage element 246-1 within the GWC 208 is reset, the pre-charge circuit 250-1 charges the global data bus 210 for a next write-operation. The detailed explanation of the GIOC 202 and LIOC 204, in terms of circuit layout and operation, is discussed in detail in the subsequent figures.

Figure 3:
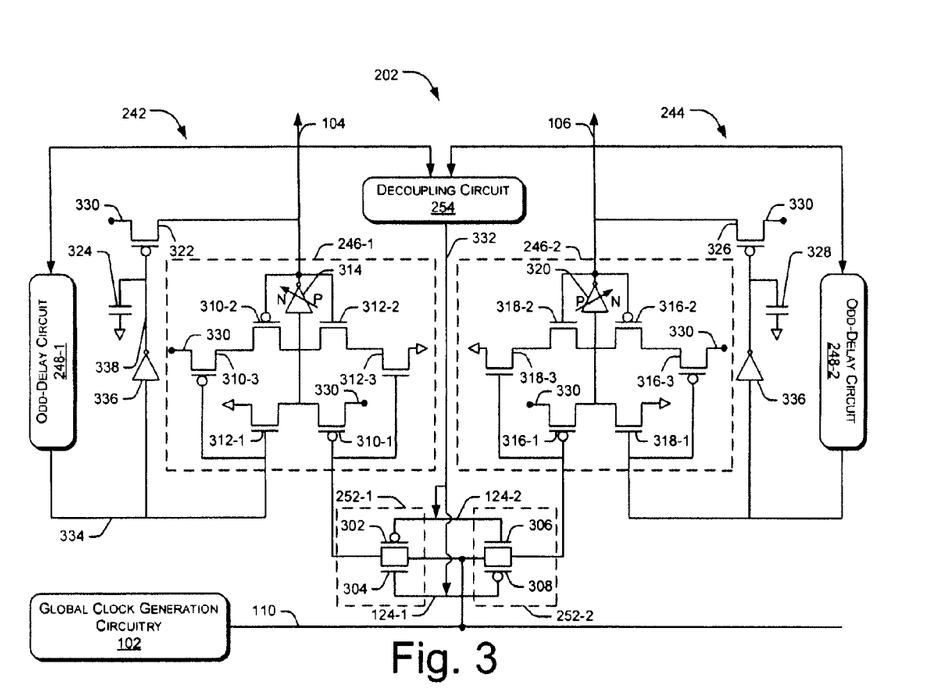
FIG. 3 illustrates the exemplary GIOC and a layout of its components in accordance with an embodiment of the present subject matter.

FIG. 3 illustrates the exemplary GIOC 202 for memory, according to an embodiment of the present subject matter. In one embodiment, the GIOC 202 includes two data buses, namely, the GWRT 104 and the GWRF 106, which facilitate propagation of the write-data to the selected memory bank when the write operation is requested. The GIOC 202 also includes the GWC 208 and the global clock generation circuitry 102 that generates the GIOC-WRCLK 110. The GIOC-WRCLK 110 activates the GWC 208 in response to a request for a write-operation. In said embodiment, a negative cycle of the GIOC-WRCLK 110 activates the GWC 208.

As illustrated in FIG. 2(b), the GWC 208 includes the full transmission gate 252 and the decoupling circuit 254. In one embodiment, the GWC 208 can be divided into global sub-write circuitries, namely the GWRT circuitry 242 and the GWRF circuitry 244. As discussed, the GWRT circuitry 242 includes the storage element 246-1, the odd-delay circuit 248-1, and the pull-up pre-charge device 250-1. Similar to the GWRT circuitry 242, the GWRF circuitry 244 is also connected to the storage element 246-2, the odd-delay circuit 248-2, and the pull-up pre-charge device 250-2. The circuitry and operation of the aforementioned devices included within the GWC 208 is discussed in the subsequent paragraphs.

In said embodiment, the full transmission gate 252 is realized using the transmission gates 252-1 and 252-2. The transmission gate 252-1 is implemented using a pMOS 302 and an nMOS 304, while the transmission gate 252-2 is implemented using an nMOS 306 and a pMOS 308. The transmission gate 252-1 is enabled on application of the DATA 124-1, while the transmission gate 252-2 is enabled on application of the DATAB 124-2. Accordingly, based upon the availability of the write-data, such as the DATA 124-1 or DATAB 124-2, either the GWRT circuitry 242 or the GWRF circuitry 244 is enabled through either of the transmission gates 252-1 or 252-2. The enabled transmission gate transfers the GIOC-WRCLK 110 to the enabled global sub-write circuitry that stores it in a corresponding storage element 246-1 or 246-2.

The storage element 246-1 is a reset-set (RS) latch circuit. It can be understood by those skilled in the art that the storage element can also be implemented using a J-K latch, a flip-flop or, in general, any single bit storage element. In one embodiment, the storage element 246-1 may be realized using two cross coupled CMOS inverters to store the write-data, such as the write-data 124-1, and provide a corresponding signal, hereinafter referred to as GWRT signal, on the GWRT 104.

A first CMOS inverter includes a pMOS 310-1, an nMOS 312-1, and a low skew inverter 314, and a second CMOS inverter includes pMOSs 310-2 and 310-3 and nMOSs 312-2 and 312-3. The pMOS 310-3 and the nMOS 312-3 are supplied with inputs (hereinafter referred to as enable inputs) at their respective gates. The second CMOS inverter offers high impedance when enable inputs are not applied, but acts as a conventional inverter on the application of enable inputs. The low skew inverter 314 makes falling transitions of the GWRT signal faster owing to its inherent property of reducing threshold voltage at which it operates. The low skew inverter 314 includes a pMOS device, which is made considerably small in size. Due to its small size, the pMOS device does not oppose falling transitions. Thus, faster falling transitions can be achieved vis-a-vis conventional inverters in which the pMOS and nMOS are biased equally and hence, speed is compromised.

Similarly, the storage element 246-2 may be realized using two cross coupled CMOS inverters to store the write-data such as DATAB 124-2 and provide a corresponding signal on the GWRF 106, hereinafter referred to as GWRF signal. A first CMOS inverter includes a pMOS 316-1, an nMOS 318-1, and a low skew inverter 320 while a second CMOS inverter includes pMOSs 316-2 and 316-3 and nMOSs 318-2 and 318-3. The pMOS 316-3 and the nMOS 318-3 are supplied with inputs (hereinafter referred to as enable inputs) at their respective gates. The second CMOS inverter offers high impedance when enable inputs are not applied, but serves as a conventional inverter when the enable inputs are applied.

Similar to the low slew inverter 314, the low skew inverter 320 makes falling transitions of the signal on the GWRF 106 faster. The capacitances, associated with the storage elements 246-1 and 246-2, are fixed irrespective of the capacitive load on the GWRT 104 and the GWRF 106 unlike the conventional GIOC 100 where due to the absence of such storage elements, the capacitance is attributed to the capacitive load on the GWRT 104 and the GWRF 106.

Further, the decoupling circuit 254 decouples the GWC 208 from the GIOC-WRCLK 110 after the write-data is stored in either the storage element 246-1 or the storage element 246-2. In one implementation, the decoupling circuit 254 is a two-input NAND gate with the GWRT signal and the GWRF signal as inputs. As soon as one of the two inputs goes low, both the transmission gates 252-1 and 252-2 are de-activated, thereby decoupling GIOC-WRCLK 110 from the GIOC 202. One of the techniques to de-activate the transmission gates 252-1 and 252-2 is to over-ride their input terminals where the DATA 124-1 and the DATAB 124-2 are applied such that both the GWRT circuitry 242 and the GWRF circuitry 244 are disabled. Since the capacitance associated with the storage element 246 is fixed, therefore, when the decoupling is achieved, the pulse width of the GIOC-WRCLK 110 does not have to be tuned locally for different compiler ranges. Thus, the pulse width of GIOC-WRCLK 110 is now independent of the compiler range.

The odd-delay circuit 248-1 and the odd-delay circuit 248-2 are implemented using an odd number of inverters to invert an incoming signal such as the GWRT or GWRF signal. In another implementation, the odd-delay circuit is programmable. The pull-up pre-charge device 250-1 can be realized using p-channel MOSFETS 322, hereinafter referred to as pre-charge 322, associated with a capacitor 324. Similarly, the pull-up pre-charge device 250-2 is implemented using a pMOS 326, also referred to as pre-charge 326, associated with a capacitor 328. Even though the description hereinafter is in terms of pre-charge 322 and pre-charge 326, it will be appreciated that the pre-charge 322 and pre-charge 326 are part of pull-up pre-charge devices 250-1 and 250-2 respectively and have been used only to simplify the explanation.

In case of a write operation, the full transmission gate 252 facilitates reduction of load on the GIOC-WRCLK 110 by selecting either GWRT circuitry 242 or the GWRF circuitry 244 for the write operation. The GIOC-WRCLK 110 is fed as an input signal to the transmission gates 252-1 and 252-2. Further, the DATA 124-1 is applied at the gates of the nMOS 304 and the pMOS 308 and the complementary write-data, such as DATAB 124-2, is applied at the gates of the pMOS 302 and nMOS 306. Also, at the drains of the pMOSs 310-1, 310-3, 316-1, 316-3, 322, and 326, a supply voltage $V_{DD}$ 330 is applied.

In one implementation, for writing "one", the write-data such as the DATA 124-1 corresponding to a logic level one is applied at the transmission gate 252-1 while the DATAB 124-2 has a logic level zero since the DATAB 124-2 is complementary to the DATA 124-1. At this instant, the transmission gate 252-1 will provide the GIOC-WRCLK 110 to the storage element 246-1, while the transmission gate 252-2 will not supply the GIOC-WRCLK 110 to the storage element 246-2.

In said implementation, the negative pulse or a zero logic level of GIOC-WRCLK 110 is a set-input for the storage element 246-1, which activates the pMOS 310-1. Thus, the storage element 246-1 is set or latched for a given set-input having a zero logic level. As a result, a high voltage corresponding to a logic level one from the $V_{DD}$ 330 is applied to the low skew inverter 314. The low skew inverter 314 inverts the logic level from "one" to "zero" and provides the same as an output signal or GWRT signal on the GWRT 104. The low skew inverter 314 makes such falling transitions faster as compared to rising transitions.

The logic level of the GWRT signal represents the presence or absence of the DATA 124-1. Meanwhile, the GIOC-WRCLK 110 can be decoupled from the selected GWC 208. This is achieved by the decoupling circuit 254 that provides a decoupling signal 332 to over-ride the values of the DATA 124-1 and the DATAB 124-2 such that both the GWRT circuitry 242 and the GWRF circuitry 244 are decoupled from the GIOC-WRCLK 110.

The GWRT signal then propagates to the LIOC (discussed later in the detailed description of FIG. 4) of a selected memory bank. The GWRT 104 will be highly capacitive or loaded if there are a large number of rows in the memory bank selected for the write operation, wherein loading gets translated in the form of a greater slant edge of the GWRT signal on the GWRT 104.

As soon as the GWRT signal having a logic level zero is received by the selected LIOC, for example, 204-1, the DATA 124-1 is transferred and latched onto the LIOC 204-1. The LIOC 204-1 is associated with the memory bank 206-1 in which the write-data needs to be written. The process of selection and latching in an LIOC will be discussed in detail in the description of FIG. 4 and FIG. 5. As the DATA 124-1 is being latched into the selected LIOC, the logic level of the GWRT signal is being tracked by the level sensitive triggering circuit 216 (shown in FIG. 2 (*a*)). When the DATA 124-1 is latched into the LIOC 204-1, the voltage level of the GWRT signal begins to change. On sensing a change in the voltage level of GWRT signal, the level sensitive triggering circuit 216 facilitates a voltage feedback signal through the GWRT 104.

The level sensitive triggering circuit 216 is operably coupled to the odd-delay circuit 248-1, which includes an odd number of inverters to provide an inverted voltage feedback signal 334. Through the odd delay circuit 248-1, the inverted voltage feedback signal 334 is fed as a reset input signal at the gates of the pMOS 310-3 and the nMOS 312-1 of the storage element 246-1. Thus, the inverted voltage feedback signal 334 facilitates resetting of the storage element 246-1.

Such resetting results in the GWRT signal having a logic level one on the GWRT 104. The odd-delay circuit 248-1 introduces a delay in providing the inverted voltage feedback signal 334 to the storage element 246-1. In an implementation, this delay is self-adjusting and depends on the edge of the GWRT signal fed into the odd-delay circuit 304. As mentioned before, the GWRT signal will be more loaded if there are more number of rows in the memory bank selected for the write operation. Thus, depending on the compiler range and the load on the GWRT 104, the rising and the falling edge of the negative pulse of the GWRT signal varies and accordingly, the delay offered by the odd delay circuit 248-1 is adjusted.

The delay provided by the odd-delay circuit 248-1 also ensures that the DATA 124-1 gets latched onto the selected LIOC before the logic level of GWRT 104 gets reset. To sum up, the delay from the odd-delay circuit 248-1 is self-adjusting and varies according to the compiler range.

The inverted voltage feedback signal 334 having a logic level one is also fed to the pre-charge 322 through an inverter 336. The inverter 336 inverts the delayed and inverted voltage feedback signal to provide an output voltage signal 338 having a logic level zero. The output of the pre-charge 322 pre-charges the GWRT 104 following the resetting of the storage element 246-1 so that the GWRT circuitry 242 can be enabled by another negative cycle of the GIOC-WRCLK 110 if and when the DATA 124-1 or DATAB 124-2 is available.

In another case, the DATA 124-1 corresponding to a logic level zero and the DATAB 124-2, which is complementary to the DATA 124-1 corresponding to a logic level one, are applied at the full transmission gate 252. At this instant, the transmission gate 252-2 is activated and the transmission gate 252-1 is de-activated. The transmission gate 252-2 allows transfer of the GIOC-WRCLK 110, having a negative pulse, to the storage element 246-2. The storage element 246-2 is connected to the GWRF 106. In addition, the odd-delay circuit 248-2, the pre-charging circuit 250-2, and an inverter 336 are also connected to the GWRF 106 and operate in a manner as explained earlier for the GWRT 104.

Conventionally, as illustrated in FIG. 1(*a*), both the pMOSs 112-1 and 112-2 used for pre-charging are charged in one cycle of the GIOC-WRCLK 110. Therefore, bigger pMOSs 112-1 and 112-2 are used so that they are charged in a smaller duration. On the other hand, in the GIOC 202, since one pull-up pre-charge device 250-1 or 250-2 is to be charged for a given period of time in a complete cycle of the GIOC-WRCLK 110, the sizes of the pMOSs-pre-charge 322 and pre-charge 326 can be kept small. Due to the reduced sizes of the pre-charge 322 and pre-charge 326, the peak current for one write operation is reduced. Therefore, after latching of the DATA 124-1 or DATAB 124-2 in the respective storage element 246-1 or 246-2, the GWRT 104 and the GWRF 106 can be pulled up even at a poor slope of the negative pulse of the GIOC-WRCLK 110 as there is still some time remaining for the cycle of the GIOC-WRCLK 110 to end.

Typically, the capacitors associated with the pre-charge devices charge and discharge in every cycle. Since capacitance is accounted as per bit in a memory, bigger the size of the memory, more is the dynamic power associated with capacitor toggling. However, a slight reduction in capacitance can lead to a huge reduction in the overall dynamic power. Due to the reduced sizes of the pre-charge 322 and pre-charge 326 and activation of one of the pre-charge 322 or pre-charge 326 in one cycle of the GIOC-WRCLK 110, the dynamic power consumption associated with the charging and discharging of the gate capacitance of the pre-charge 322 and pre-charge 326 is reduced.

As mentioned before, the odd delay circuit 248-1 tracks the delay for the write operation to be completed in the selected LIOC, such as the LIOC 204-1, and accordingly resets the GWC 208. However, for memory banks with large number of rows, RC time delays begin to surface. Therefore, to track the impact of vertical resistance in the GWRT 104 and the GWRF 106, a programmable odd-delay circuit and programmable pre-charge devices can be implemented in another embodiment of the GIOC 202. The programmable delay in the odd-delay chain is realized by sensing the voltage level of the GWRT/GWRF signals and accordingly, increasing or reducing the inverters from the odd delay chain. The delay can vary according to the number of rows in the selected memory bank. Such an embodiment provides for latching of write-data onto the LIOCs (discussed later in the description of FIG. 4) for varying compiler ranges by keeping track of the impact caused by the RC time delays.

Figure 4:
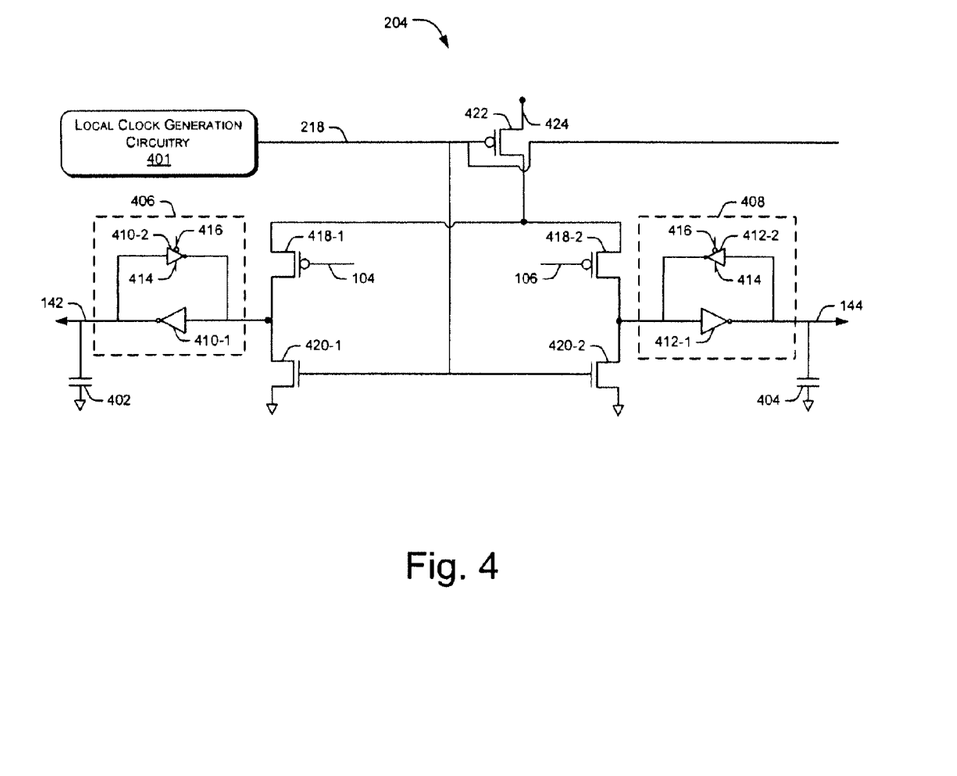
FIG. 4 illustrates the exemplary LIOC and a layout of its components for a memory in accordance with an embodiment of the present subject matter.

FIG. 4 illustrates an exemplary local input and output circuitry (LIOC) 204 for a memory with respect to one embodiment of the present subject matter. As described in FIG. 2(*a*), the LIOC 204 such as LIOC 204-1 includes the LWC 212-1, the local clock generation circuitry 401, and the local data bus 214. In FIG. 4, the LWC 212 is illustrated as a network of storage elements, pass transistors, capacitors, etc. The LWC 212 is configured to receive the write-data from the GIOC 202 via data buses GWRT 104 and GWRF 106, and transfer the write-data to the associated memory bank selected for a write operation. The local data bus 214 includes a bit line having two components, namely bit line true (BLT) 142 and bit line false (BLF) 144. The BLT 142 and the BLF 144 are coupled to a column multiplexer (not shown in the figure) of the memory banks 206. The BLT 142 and the BLF 144 are complementary to each other. The BLT 142 is connected to a capacitor 402, hereinafter referred to as $C_{BLT}$ 402, while the BLF 144 is connected to a capacitor 404, hereinafter referred to as $C_{BLF}$ 404. Further, the BLT 142 and the BLF 144 are connected to two storage elements 406 and 408, respectively.

The storage elements 406 and 408 are implemented as RS latch circuits in one embodiment, but they can be implemented using any single bit storage elements such as a flip-flops, etc. in other embodiments. The storage element 406 is realized with the help of an inverter 410-1 and a tri-state inverter 410-2. The tri-state inverter 410-2 has two additional enable inputs: a first enable input 414 and a second enable input 416. The inverter 410-1 is a conventional inverter. On the other hand, the tri-state inverter 410-2 behaves like a conventional inverter when the enable inputs, such as 414 and 416, are applied. However, when the enable inputs are not applied, the tri-state inverter 410-2 offers high impedance at the output. In this way, the tri-state inverter 410-2 can act like an open circuit and thus, allow the inverter 410-1 to control the output at the BLT 142. Similarly, the storage element 408 is realized with the help of an inverter 412-1 and a tri-state inverter 412-2 having the two additional enable inputs 414 and 416.

Further, pMOSs 418-1 and 418-2 and nMOSs 420-1 and 420-2 are pass transistors, which are used to transfer the write-data from the GIOC 202 through the global write data bus such as GWRT 104, to the storage elements 406 and 408. The pMOS 418-1 can be connected to the GWRT 104 and can receive the GWRT signal from the GWRT 104 for its operation. Similarly, the pMOS 418-2 can be connected to the GWRF 106 and can receive the GWRF signal from the GWRF 106 for its operation.

Unlike the conventional LIOCs, such as the LIOC 140, if the LIOC 204-1 is associated with the selected memory bank, MB 206-1 in this case, then the local clock generation circuitry 401 generates a local write clock signal or the active low YCLK-WR 218 for the LIOC 204-1. The YCLK-WR 218 is a multiplexed signal of a conventional write enable signal, a conventional local clock signal (also referred to as local signal), and a signal corresponding to the most significant bits of the row address.

Further, the active low YCLK-WR 218 is provided to the LIOC 204-1 only, while an active high YCLK-WR 218 is provided to rest of the LIOCs. In another implementation, the YCLK-WR 218 is an active high signal for the selected LIOC 204-1 and an active low signal for the LIOCs of non-selected memory banks. In one implementation, the YCLK-WR 218 is provided at the gate of pMOS 422. The YCLK-WR 218 activates the LIOC 204 of the selected memory bank as and when the write operation is requested. The YCLK-WR 218 is also applied to the tri-state inverter at the first enable input 414, while an inverted or complementary signal of the YCLK-WR 218 is applied to the second enable input 416 of the tri-state inverter to set the storage element 406 or 408 when the YCLK-WR 218 is an active low signal. Also, a supply voltage $V_{DD}$ 424 is applied at the drain of the pMOS 422.

In said implementation, when an active low YCLK-WR 218 is applied at the gate of the pMOS 422, activation of the pMOS 422 takes place. Simultaneously, the GWRT 104 from the GIOC 202 is applied at the gate of the pMOS 418-1 and the GWRT 106 from the GIOC 202 is applied at the gate of the pMOS 418-2. If the GWRT 104 has the DATA 124-1, the pMOS 418-1 is activated while the pMOS 418-2 remains disabled. At this instant, when both the pMOS 418-1 and the pMOS 422 are activated, a high voltage signal from the supply voltage $V_{DD}$ 424 having a logic level one is applied to the storage element 406. Subsequently, the storage element 406 inverts and latches the received write-data such as the DATA 124-1 to produce an output signal having a logic level zero.

As soon as the input is latched in the storage element 406, the GWRT signal is decoupled from the LIOC 204 of the selected memory bank through resetting of the GWRT circuitry 242 in the GIOC 202 using the level sensitive triggering circuit 216 and the odd delay circuit 248-1, as explained in the description of FIG. 3. In other words, since after latching of the DATA 124-1 onto the LIOC 204-1, the GWRT signal is decoupled, therefore the GWRT 104 and the GWRF 106 can be reset. As a result, there is a reduction in the capacitive load associated with the GWRT 104 and more time is available to reset the GWRT 104 and the GWRF 106. Thus, the size of the pre-charge 322 and pre-charge 326 can be further reduced, thereby reducing peak power consumption. There is also a reduction in the overall cycle time since the resetting of the GIOC 202 is now independent of the LIOC 204, i.e., the former does not have to wait for the completion of the write operation in the latter. Hence, resetting of both the GIOC 202 and the LIOC 204 can now be carried out in parallel.

As a result of decoupling between the GWRT 104 and the LIOC 204, a positive pulse of the GWRT signal cannot reset status of the storage element 406. Also, as the output signal of the storage element 406 goes low, the capacitor $C_{BLT}$ 402 starts to discharge and, in the process, provides a high voltage signal having a logic level one to a memory cell in the selected memory bank, such as the memory bank 206-1, through the column multiplexer. This increases the voltage level in the memory cell, which corresponds to the storage of one bit of data, i.e., DATA 124-1 in the memory cell. Since the capacitances of the BLT 142 and the BLF 144 are quite high and the GWRT signal is decoupled from the BLT 142, resetting of the GWRT 104 in GIOC 202 can be done in parallel to the $C_{BLT}$ 402 discharge.

As discussed, the GWRF signal on GWRF 106 is applied to the gate of the pMOS 418-2. In an implementation, when a negative pulse GWRF signal (indicating availability of the DATAB 124-2) is applied at the gate of the pMOS 418-2 and the YCLK-WR 218 having a negative pulse is applied at the gate of pMOS 422, a similar operation takes places as explained earlier for the GWRT 104.

In said implementation, for a logic level one of YCLK-WR 218, the pMOS 422 is not activated and thus, the LIOC 204-1 is not activated for the write operation. The YCLK-WR 218 is also applied at the gate of the nMOS 420-1 and the nMOS 420-2. For a logic level one of the YCLK-WR 218, the nMOSs 420-1 and 420-2 are activated and the LIOC 204-1 is reset.

Figure 5:
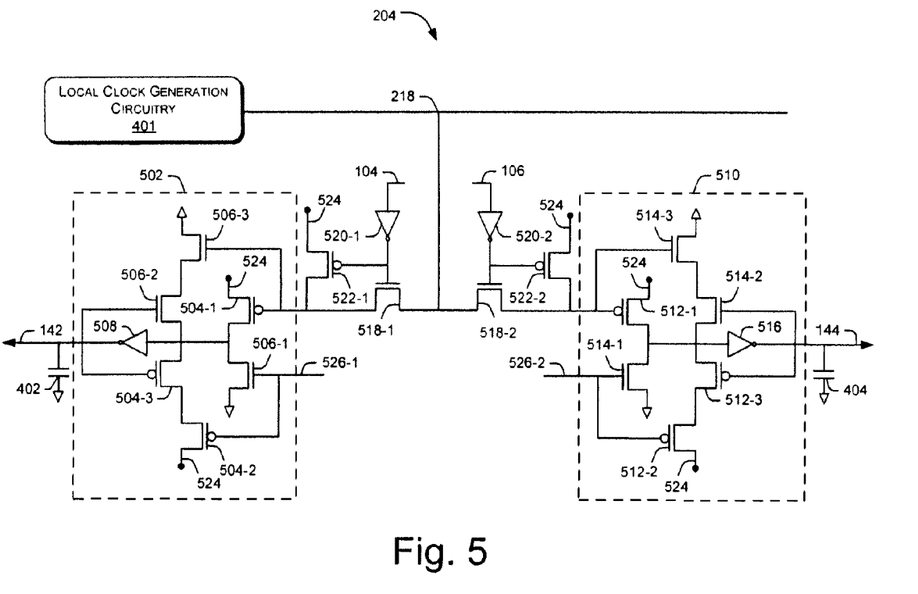
FIG. 5 illustrates the exemplary LIOC and a layout of its components in accordance with another embodiment of the present subject matter.

FIG. 5 illustrates the exemplary local input and output circuitry (LIOC) 204 associated with a memory bank 206 with respect to a second embodiment of the present subject matter. Similar to the previously discussed embodiment of the LIOC 204 in the description of FIG. 4, the second embodiment also includes the bit line true (BLT) 142 and the bit line false (BLF) 144. The BLT 142 and the BLF 144 are complementary to each other as already mentioned earlier. The BLT 142 is connected to the capacitor $C_{BLT}$ 402, while the BLF 144 is connected to the capacitor $C_{BLF}$ 404. The BLT 142 is also connected to a storage element 502, such as an RS latch circuit, which can be realized with the help of two cross coupled CMOS inverters. The first CMOS inverter includes a pMOS 504-1, an nMOS 506-1, and an inverter 508, and the second CMOS inverter includes pMOSs 504-2 and 504-3 and nMOSs 506-2 and 506-3 having enable inputs at the gates of the nMOS 506-3 and the pMOS 504-2. A set-input for the storage element 502 is received at the gate of the pMOS 504-1, while a reset-input for the storage element 502 is received at the gate of the nMOS 506-1.

Similarly, the BLF 144 is connected to a storage element 510, such as an RS latch circuit, which can also be realized with the help of two cross coupled CMOS inverters. The first CMOS inverter includes a pMOS 512-1, an nMOS 514-1, and an inverter 516, and the second inverter includes pMOSs 512-2 and 512-3 and nMOSs 514-2 and 514-3 having enable inputs at respective gates of the nMOS 514-3 and the pMOS 512-2. A set-input for the storage element 510 is received at the gate of the pMOS 512-1, while a reset-input for the storage element 510 is received at the gate of the nMOS 514-1. The storage elements 502 and 514 are similar to the storage elements 246-1 and 246-2 implemented in the GIOC 202 as explained in the description of FIG. 3.

In operation, the local write clock signal (YCLK-WR) 218 is received from a selected memory bank to activate the associated LIOC 204, such as LIOC 204-1, for the write operation. In an implementation, in order to perform a write operation, the YCLK-WR 218 having a negative pulse, corresponding to the logic level zero, is applied at the respective drains of the nMOSs 518-1 and 518-2. The GWRT signal having a logic level zero, which refers to the presence of the DATA 124-1 on the GWRT 104 as explained in description of FIG. 3, is applied to the inverter 520-1. The inverter 520-1 provides an output signal, which is applied at the respective gates of a pMOS 522-1 and the nMOS 518-1. The drains of the pMOSs 504-1, 504-2, 512-1, and 512-2 are provided with a supply voltage $V_{DD}$ 524.

Upon receiving a GWRT signal having a logic level zero, the inverter 520-1 generates an output signal having a logic level one, i.e., an output signal having a high voltage is produced. Such an output signal does not activate the pMOS 522-1 but activates the nMOS 518-1. The activated nMOS 518-1 allows supply of the YCLK-WR 218 having the logic level zero to the gate of the pMOS 504-1 of the storage element 502. Further, the YCLK-WR 218 activates the storage element 502 to latch the received write data, such as the DATA 124-1, from the GWRT 104 and provide an output signal having a logic level zero through the inverter 508.

Since the output signal has a logic level zero or in other words, the output signal has a low voltage, the $C_{BLT}$ 402 starts to discharge and writes the DATA 124-1 in the selected memory bank through a column multiplexer as explained in the detailed description of FIG. 4. In another case, when a GWRF signal having a negative pulse from the GIOC 202 is applied to the inverter 520-2, and the YCLK-WR 218 having a negative pulse is applied at the drain of nMOS 518-2 and the pMOS 522-2, the storage element 510 latches the DATAB 124-2 as explained earlier for the GWRT 104.

Now, in order to reset the storage element 502 for another cycle of the GWRT 104, an external reset signal 526-1, hereinafter referred to as WRST 526-1, is applied at the gate of the nMOS 506-1 of the storage element 502. In one implementation, the WRST 526-1 may be provided by a positive pulse of the YCLK-WR 218 at the end of the write cycle. A similar external reset signal 526-2, hereinafter referred to as WRSF 526-2, is also applied at the gate of the nMOS 514-1 in order to perform an analogous operation for the storage element 510. Since, the overall operation of charging and discharging of the $C_{BLT}$ 402 and $C_{BLF}$ 404 is controlled by YCLK-WR 218, the overall dynamic power consumption is significantly reduced as the YCLK-WR 218 is activated only for the selected memory bank, such as the MB 206-1.

The GWC 208 and the LWC 212, collectively referred to as write circuitry, can be used for self-adjustable pre-charging of a GIOC 202, for reducing peak current consumption during charging and discharging of the GIOC 202, and for reducing tuning of the pulse width of a GIOC-WRCLK 110 for different memory banks. The write circuitry further ensures fast propagation of write-data to the LIOC of the selected memory bank by reducing the overall cycle time of the GIOC-WR-CLK 110. In addition, the write circuitry reduces dynamic power dissipation by facilitating replication of the write-data from the GIOC 202 to only the LIOC 204 of the selected memory bank. Moreover, due to decoupling of the GIOC-WRCLK 110 and activation of one pull-up pre-charge device at a given time in a complete cycle of the GIOC-WRCLK 110, the size of the pull-up pre-charge devices can be reduced. Thus, the peak current and the dynamic power dissipation on account of charging and discharging of gate capacitance of the pull-up pre-charge devices can be considerably reduced.

Figure 6:
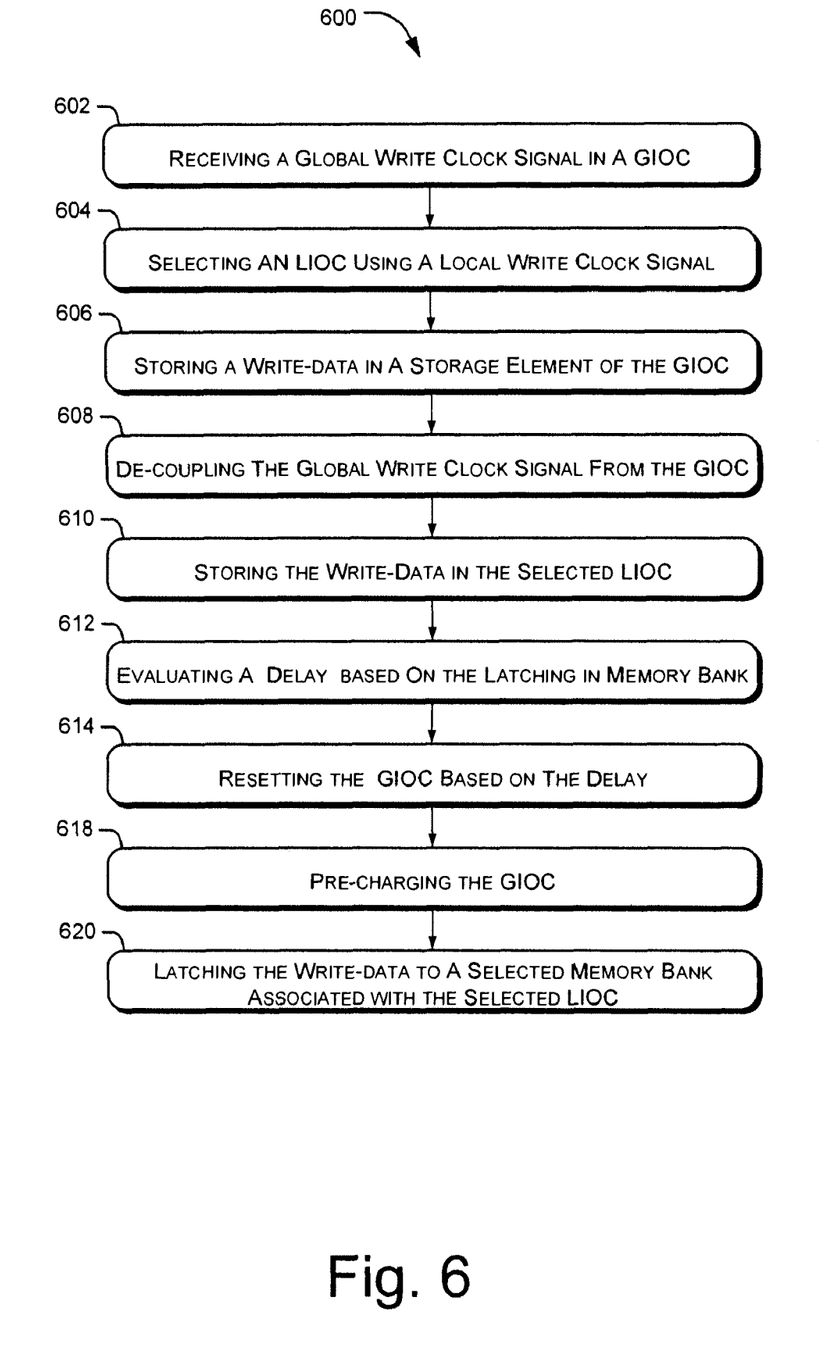
FIG. 6 illustrates an exemplary method for transferring a write-data from the exemplary GIOC to a selected memory bank through the exemplary LIOC associated with the selected memory bank, in accordance with an embodiment of the present subject matter.

FIG. 6 illustrates an exemplary method for transferring the write-data, such as the DATA 124-1, from the exemplary GIOC 202 to the selected memory bank 206 through an exemplary LIOC, such as the LIOC 204-1, associated with a selected memory bank such as the memory bank 206-1. The exemplary method may be described in the general context of computer executable instructions or electronically implementable processes. Generally, computer executable instructions can include routines, programs, objects, components, data structures, procedures, modules, functions, etc., that perform particular functions or implement particular abstract data types. However, the methods are also electronically implementable through analog and digital circuit elements. In one implementation, the instructions are performed by various components of the GIOC 202 and LIOCs 204 as illustrated in the explanation of FIG. 2(*a*).

The order in which the method is described is not intended to be construed as a limitation, and any number of the described method blocks can be combined in any order to implement the method, or an alternative method. Additionally, individual blocks may be deleted from the method without departing from the spirit and scope of the subject matter described herein.

At block 602, a global write clock signal is received by a GIOC. The global clock generation circuitry 102 provides the global write clock signal (GIOC-WRCLK) 110 to facilitate write-data propagation in the GIOC 202. In one implementation, the GIOC-WRCLK 110 is an active low signal.

At block 604, an LIOC is selected by a local write clock signal. Based on the write operation, a memory bank, for example, the memory bank 206-1, is selected by activating its memory select signal 220. Each memory bank is associated with at least one LIOC. Based on the selection of the memory bank, the YCLK-WR 218 selects the one or more LIOCs, for example, LIOC 204-1, associated with the selected memory bank 206-1. In one implementation, the YCLK-WR 218 is a derivative of the local signal.

At block 606, a write-data is stored in a storage element of the GIOC. On receiving a request for the write operation (say for writing "one" or "zero"), the full transmission gate 252 transmits the GIOC-WRCLK 110 to the GWRT circuitry 242 or the GWRF circuitry 244 based on the write-data. The GWRT circuitry 242 or the GWRF circuitry 244 includes the storage element 246-1 and 246-2, respectively. For writing "one", the GWRT circuitry 242 is selected and the write data, for example, the DATA 124-1, is stored in the storage element 246-1. Further, the stored write data is provided on the GWRT 104 as an active-low GWRT signal. For writing "zero", the GWRF circuitry 244 is selected and the write-data, for example, the DATAB 124-2, is stored in the storage element 246-2, which is further provided on the GWRF 106 as an active-low GWRF signal.

At block 608, the global write clock signal is decoupled from the GIOC. After determining whether the write-data is stored in the selected global sub-write circuitry or not; the selected global sub-write circuitry is disabled based on the determination. After the GWRT signal or the GWRF signal is obtained on the respective buses, the GIOC-WRCLK 110 is decoupled from the GIOC 202 in order to make the designing of GIOC-WRCLK 110 independent of the compiler range. The decoupling is performed by disabling the full transmission gate 252 such that the GIOC-WRCLK 110 is unable to activate any of the global sub-write circuitries.

At block 610, the write-data is stored into the selected LIOC. The write data stored in the GIOC in block 606 is transferred to the LIOC selected in block 604 through a global data bus such as the GWRT 104 or the GWRF 106. The selected LIOC, i.e., LIOC 204-1, includes a storage element such as the storage element 406 in which the write-data is stored for subsequent operations.

At block 612, a delay is evaluated based on the storing of the write-data in the selected LIOC. In one implementation, the level sensitive triggering circuit 216 monitors the change in the voltage level of the GWRT signal or the GWRF signal as the write-data is being stored into the selected LIOC 204-1 through the respective write data bus. The change in the voltage level is indicative of the completion of storing operation in the selected LIOC 204-1. Such monitoring helps in delaying the resetting of the GIOC 202 until the storing is complete in the LIOC 204-1. Thus, the resetting process is self-adjusting. In said implementation, the delay is computed using an odd-number of inverters or an odd-delay circuit such as 248-1. In another implementation, the delay is computed by a programmable odd-delay circuit.

At block 614, the GIOC is reset based on the evaluated delay. In one implementation, the GIOC 202 is not reset until the write-data is stored in the storage element of the selected LIOC 204-1. For example, after the DATA 124-1 is stored in the selected LIOC 204-1, a storage element such as 246-1 is reset by a delayed and inverted voltage feedback signal provided by the odd-delay circuit 248-1. The resetting of the storage element 246-1 provides an inversion in the logic level of the GWRT signal in the GWRT 104. As a result, the selected LIOC 204-1 gets decoupled from the respective GWC 208, for example, the GWRT circuitry 242.

At block 618, the GIOC is pre-charged. Following the decoupling of the GIOC 202 from the selected LIOC 204-1, the GIOC 202 is charged for a next write-operation. For this purpose, a pre-charging circuit, such as pre-charging circuit 250-1, charges the GWRT 104.

At block 620, the write-data is stored in the selected memory bank associated with the selected LIOC. To complete the write operation, the write-data is stored in the memory bank 206-1 selected for the write operation. For example, the DATA 124-1 is transferred from the storage element 406 to a memory cell within the memory bank 206-1 through the local data bus 214. After the write operation, the LIOC 204-1 can also be reset for the next write operation. In one implementation, this is done by applying an active high YCLK-WR 218.

As mentioned before, the separate decoupling of the GIOC 202 and LIOCs 204 ensures that the peak current and the dynamic power dissipation are considerably reduced. A reduced designing tuning effort over a large compiler range is also obtained. Additionally, the size of the components, such as pre-charging devices, is also reduced leading to a more power efficient and compact memory architecture. The resulting memory architecture also ensures fast write-data propagation to the selected memory banks.

Although embodiments for a write circuitry for a hierarchical memory architecture have been described in language specific to structural features and/or methods, it is to be understood that the invention is not necessarily limited to the specific features or methods described. Rather, the specific features and methods are disclosed as exemplary embodiments for the write circuitry for a hierarchical memory architecture.

We claim:

1. A memory architecture comprising:
   a plurality of local input and output circuitries (LIOCs), each LIOC coupled to at least one memory bank; and
   a global input and output circuitry (GIOC) coupled to the plurality of LIOCs, the GIOC comprising a plurality of global sub-write circuitries, wherein one global sub-write circuitry out of the plurality of global sub-write circuitries is enabled to provide a write-data to a selected LIOC from the plurality of LIOCs,
   wherein the memory architecture comprises a level sensitive triggering circuit coupled to each of the plurality of LIOCs and the GIOC to indicate storage of the write-data in a storage element of the selected LIOC, and wherein the GIOC comprises an odd-delay circuit coupled to the level sensitive triggering circuit, and wherein the odd-delay circuit provides a feedback signal to reset the GIOC based on the indication.

2. The memory architecture as claimed in claim 1, wherein the selected LIOC is selected based on a local write clock signal.

3. The memory architecture as claimed in claim 2, wherein the memory architecture comprises a local write clock generation circuitry configured to generate the local write clock signal.

4. The memory architecture as claimed in claim 3, wherein the local write clock generation circuitry is configured to provide a multiplex of a write-enable signal, a local signal, and a row address signal.

5. The memory architecture as claimed in claim 1, wherein the selected LIOC comprises an LIOC associated with a memory bank selected for a write operation.

6. The memory architecture as claimed in claim 1, wherein the memory architecture comprises a global clock generation circuitry configured to generate a global write clock signal to facilitate write-data propagation into the selected LIOC.

7. The memory architecture as claimed in claim 1, wherein the enabled global sub-write circuitry is enabled through activation of a full transmission gate, wherein the full transmission gate is activated by the write-data.

8. The memory architecture as claimed in claim 1, wherein the level sensitive triggering circuit comprises a Schmitt trigger.

9. The memory architecture as claimed in claim 1, wherein each of the LIOCs comprises a plurality of storage elements to store the write-data.

10. The memory architecture as claimed in claim 9, wherein the storage elements comprise reset-set latches.

11. The memory architecture as claimed in claim 9, wherein the storage elements are reset by an external reset signal.

12. A method comprising:
   selecting at most one local input and output circuitry (LIOC) from a plurality of LIOCs, wherein the plurality of LIOCs are coupled to a global input and output circuitry (GIOC);
   transferring a write-data from the GIOC to the selected LIOC through a global data bus; and
   decoupling the GIOC from the selected LIOC based on transfer of the write-data to the selected LIOC,
   wherein the decoupling comprises tracking the transfer of the write-data, computing a delay based on the tracking, and resetting the GIOC depending on the computed delay, and
   wherein the tracking comprises monitoring a change in voltage level of the global write-data bus.

13. The method as claimed in claim 12, wherein the method further comprises:
   selecting a memory bank associated with the selected LIOC for writing the write-data; and
   storing the write-data into the selected memory bank.

14. The method as claimed in claim 12, wherein the selecting comprises providing a local write clock signal to select the at most one LIOC.

15. The method as claimed in claim 12, wherein the method comprises charging the GIOC for a next write operation.

* * * * *